(12) United States Patent
Wang et al.

(10) Patent No.: US 9,046,784 B2
(45) Date of Patent: Jun. 2, 2015

(54) NANOPOROUS FILM PATTERNED BY DIRECT PHOTOLITHOGRAPHY AND METHOD FOR PREPARING THE SAME

(71) Applicant: Tsinghua University, Beijing (CN)

(72) Inventors: Xiaohong Wang, Beijing (CN); Caiwei Shen, Beijing (CN)

(73) Assignee: Tsinghua University, Beijing (CN)

( * ) Notice: Subject to any disclaimer, the term of this patent is extended or adjusted under 35 U.S.C. 154(b) by 0 days.

(21) Appl. No.: 14/004,757

(22) PCT Filed: Apr. 27, 2013

(86) PCT No.: PCT/CN2013/000484
§ 371 (c)(1),
(2) Date: Sep. 12, 2013

(87) PCT Pub. No.: WO2013/170624
PCT Pub. Date: Nov. 21, 2013

(65) Prior Publication Data
US 2014/0295331 A1    Oct. 2, 2014

(30) Foreign Application Priority Data

May 15, 2012   (CN) .......................... 2012 1 0151084

(51) Int. Cl.
*G03F 7/40* (2006.01)
*G03F 7/00* (2006.01)
*B05D 1/00* (2006.01)

(52) U.S. Cl.
CPC  *G03F 7/405* (2013.01); *G03F 7/00* (2013.01); *B05D 1/00* (2013.01)

(58) Field of Classification Search
CPC .............. G03F 7/00; G03F 7/405; B05D 1/00
USPC ........................ 430/9, 18, 198, 322, 325, 330
See application file for complete search history.

(56) References Cited

U.S. PATENT DOCUMENTS

| 5,542,558 | A | 8/1996 | Benz et al. |
| 8,349,547 | B1 * | 1/2013 | Burckel et al. ................. 430/322 |
| 2003/0008244 | A1 * | 1/2003 | Khanarian et al. ............ 430/321 |
| 2008/0214687 | A1 | 9/2008 | Muller et al. |

FOREIGN PATENT DOCUMENTS

| CN | 101203554 | 6/2008 |
| CN | 102035043 | 4/2011 |
| CN | 102247764 | 11/2011 |
| CN | 102689870 | 9/2012 |
| WO | WO 2006/119915 | 11/2006 |
| WO | WO 2006/135966 | 12/2006 |
| WO | WO 2011/035689 | 3/2011 |

OTHER PUBLICATIONS

International Search Report with Written Opinion corresponding to International Patent Application No. PCT/CN2013/000484—English Translation Not Possessed.

* cited by examiner

*Primary Examiner* — John A McPherson
(74) *Attorney, Agent, or Firm* — Lathrop & Gage LLP

(57) ABSTRACT

A nanoporous film patterned by direct photolithography and a method for preparing the same are provided. Since a precursor of the material is the mixture of a nano template material and a photoresist and the mixture still has the basic physical properties of the photoresist, a film is formed on a substrate by a standard photolithography process and a micro-sized patterned structure is realized. The mixture with the patterned structure is chemically etched to remove the template material to form a porous polymer film, or the mixture with the patterned structure is carbonized at a high temperature and then the template material is removed to form a porous carbon film. The nanoporous film patterned by direct photolithography and the method for preparing the same have the advantages of simple operation, low cost and good integration with other micro electric mechanical systems.

5 Claims, 1 Drawing Sheet

NANOPOROUS FILM PATTERNED BY DIRECT PHOTOLITHOGRAPHY AND METHOD FOR PREPARING THE SAME

CROSS-REFERENCE TO RELATED APPLICATIONS

This application is a U.S. National Stage Application under 35 U.S.C. §371 of International Patent Application No. PCT/CN2013/000484, filed on Apr. 27, 2013, which claims the benefit of and priority to Chinese Patent Application No. 201210151084.X filed on May 15, 2012, each of which is hereby incorporated by reference in its entirety.

FIELD

The present disclosure relates to the field of porous materials and micro machining techniques, particularly to a nanoporous film patterned by direct photolithography and a method for preparing the same.

BACKGROUND

Nanoporous materials such as nanoporous polymers, nanoporous carbons, are applied widely in subjects of chemistry, biology, environment, and energy, etc., for example, in gas separation, absorption, water purification, large-molecular filtering, sensing materials, medicine transportation, catalyst carriers, hydrogen storage, super capacitor electrodes, and so on. Thus, nanoporous materials and preparation methods thereof have been widely researched, and the field thereof is considered as one of the most promising nanotechnology fields.

A key point for preparing nanoporous materials is how to control the structure and size of nano pores. Among all the methods, one method which is capable of easily adjusting nano pore structures is named as a template method. The template method comprises: mixing a template material having nano structures with a matrix material, and removing the template material by means of chemical etching to obtain a matrix material having nanoporous structures. Among the template materials, nano silicon oxide particles are applied most widely, because the preparation of the nano silicon oxide particles is simple, the nano size is easy to control, and nano silicon oxide particles have fine homogeneity.

On the other hand, with the development of the micro electric mechanical system (MEMS) technique, the MEMS is crossed with many other subjects, which provides microchips with more and more functions. Further, these functions tend to be realized in application, such as bio-chips, micro-sensors, and so on. In such cases, chemical materials and biological materials always play a key role in the performance of chips. Certain materials, such as organic polymers, can be prepared by photolithography and etching, or soft photolithography. Non-conventional materials, such as carbon materials, however, can be prepared by chemical vapor deposition (CVD) or by carbonizing photoresists so as to obtain the micro structure. Nanoporous materials have a promising application in various sensors and micro energy systems. However, it is scarcely successfully used in micro devices. The main reason is the incompatibility between the nanoporous material and the micro processing technique, or the too complicated operations during the step of adding nanoporous materials in micro devices.

SUMMARY

The present invention aims at providing a nanoporous film patterned by direct photolithography and a method for preparing the same.

According to a first aspect of the present disclosure, a nanoporous film patterned by direct photolithography is provided. The nanoporous film is a nanoporous polymer film having a patterned structure or a nanoporous carbon film having a patterned structure.

According to a second aspect of the present disclosure, a method for preparing the nanoporous film patterned by direct photolithography is provided. The method comprises the steps of:

1) mixing: stirring a photoresist, adding a nano template material to the photoresist under the stirring with a weight ratio between the nano template material and the photoresist of 1:(1-20), adding a solvent to adjust viscosity with a weight ratio between the solvent and the nano template material of (0-10):1 to obtain a mixture, then subjecting the mixture to a mechanical stirring or a magnetic stirring for 1-2 hours and then an ultrasonic agitation for 0.5-2 hours, and repeating the mechanical stirring or the magnetic stirring and the ultrasonic agitation for 3-5 times to obtain an agitated mixture;

2) coating and prebaking: spin coating the agitated mixture on a substrate with a rotating speed of about 200-4000 rpm to form a mixture film on the substrate, and baking the mixture film at a temperature of 80-100° C. for 3-30 minutes;

3) exposing and post-baking: exposing the mixture film with a photolithography machine, with an exposure intensity of 60-3000 mJ/cm$^2$, then baking the mixture film at a temperature of 80-100° C. for 3-30 minutes;

4) developing and solidifying: developing the mixture film with a developing solution to form a lithographic pattern on the mixture film, then baking the mixture film having an ichnography pattern corresponding to the lithographic pattern at a temperature of 100-120° C.;

5) removing nano template material: etching the mixture film having the ichnography pattern with a hydrofluoric acid solution or a mixed solution of hydrofluoric acid and ethanol with a volume ratio of 1:(1-5) to remove the nano template material to obtain the nanoporous polymer film, or heating the mixture film having the ichnography pattern to a temperature of 600-1500° C. under an inert gas atmosphere of nitrogen or argon or under vacuum, maintaining the temperature for 10-300 minutes to perform carbonization, and etching the mixture film with the hydrofluoric acid solution or the mixed solution of hydrofluoric acid and ethanol after cooling the mixture film to room temperature to remove the nano template material to obtain the nanoporous carbon film.

In some embodiments, the substrate is a silicon sheet, a glass sheet, or a polished metal sheet.

In some embodiments, the nano template material is nano silicon oxide particles with a particle diameter of 5-500 nm or a nanoporous silica gel with a pore size of 1-200 nm.

In some embodiments, the photoresist is a negative photoresist.

In some embodiments, the solvent is one of alcohols, ketones, and esters.

A micro scale pattern may be directly formed on a nanoporous polymer film or a nanoporous carbon film by a one-step standard photolithography and a one-time etching. The process for forming the pattern is easy in operation and low in cost. Further, the nanoporous film is prepared by a whole wafer-level process, which is the key to batch fabrication of micro systems, and it has excellent compatibility with other micro electric mechanical systems. Therefore, the nanoporous film may be used as a key functional material for various applications, such as sensors, micro energy storage devices, etc.

DETAILED DESCRIPTION

Embodiment 1

Figure 1:
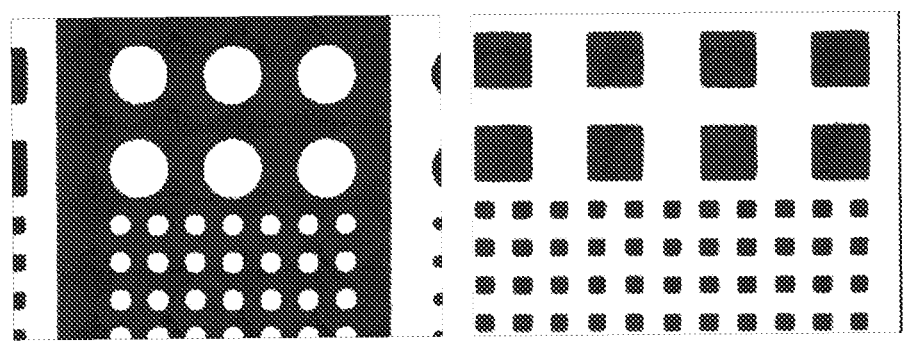
FIG. 1 shows a nanoporous carbon film having an ichnographic pattern observed under a microscope.

1 g of oleophilic nano silicon oxide particles (with a silicon oxide content of more than 99% and a particle diameter of about 30 nm) and 7 g of SU-8 photoresist series (model No. SU-8 2010) were mixed, and 3 g of cyclopentanone was added as a solvent for adjusting viscosity, so as to form a mixture. The mixture was subjected to a magnetic stirring for 7 hours and an ultrasonic agitation for 3 hours under a dark condition, until the mixture was mixed uniformly.

A silicon sheet was placed in a spin coater, and the rotating speed was adjusted to 1200 rpm. The uniformly mixed mixture was spin coated on the substrate (i.e. silicon sheet) to form a mixture film on the substrate, and the mixture film was prebaked at a temperature of 95° C. for 3 min. After cooled to room temperature, the mixture film was exposed with a photolithography machine, with an exposure intensity of 496 mJ/cm$^2$, and then post-baked at a temperature of 95° C. for 3 min. The mixture film was developed with a dedicated developing solution for the SU-8 photoresist series to form a lithographic pattern in the mixture film. Then, the mixture film was baked at a temperature of 120° C. for 5 min to obtain a mixture film having an ichnographic pattern corresponding to the lithographic pattern and a thickness of 20 μm.

The mixture film having the ichnographic pattern was etched with a hydrofluoric acid solution (4 wt %) for 30 min to obtain a nanoporous polymer film having the ichnographic pattern, in which the polymer component was a cross-linked SU-8.

The nanoporous polymer film having the ichnographic pattern was removed from the substrate and measured by a nitrogen absorption test. The results show the nanoporous polymer film has a specific surface area of 22.4 m$^2$/g, a pore volume of 0.105 cm$^3$/g, and an average pore diameter of 18.7 nm.

Embodiment 2

3 g of oleophilic nano silicon oxide powders (with a silicon oxide content of more than 99% and a particle diameter of about 30 nm) and 21 g of SU-8 photoresist series (model No. SU-8 2010) were mixed, and 6 g of cyclopentanone was added as a solvent for adjusting viscosity, so as to form a mixture. The mixture was subjected to a magnetic stirring for 4 hours and an ultrasonic agitation for 2 hours under a dark condition, until the mixture was mixed uniformly.

A silicon sheet was placed in a spin coater, and the rotating speed was adjusted to 1500 rpm. The uniformly mixed mixture was spin coated on the substrate (i.e. silicon sheet) to form a mixture film on the substrate, and the mixture film was prebaked at a temperature of 95° C. for 3 min. After cooled to room temperature, the mixture film was exposed with a photolithography machine, with an exposure intensity of 496 mJ/cm$^2$, and then post-baked at a temperature of 95° C. for 3 min. The mixture film was developed with a dedicated developing solution for the SU-8 photoresist series to form a lithographic pattern in the mixture film. Then, the mixture film was baked at a temperature of 120° C. for 5 min to obtain a mixture film having an ichnographic pattern corresponding to the lithographic pattern and a thickness of 8 μm.

The mixture film having the ichnographic pattern was heated to a temperature of 900° C. under a nitrogen atmosphere, and cooled to room temperature after maintaining the temperature of 900° C. for 1 hour. The cooled mixture film was etched with a mixed solution of a hydrofluoric acid solution (8 wt %) and ethanol with a volume ratio of 1:1 for 30 min to obtain a nanoporous carbon film having the ichnographic pattern. The ichnographic pattern of the nanoporous carbon film was shown in FIG. 1. FIG. 1 shows the ichnographic pattern of the nanoporous carbon film, observed under a microscope and enlarged by 50 times. In FIG. 1, the larger circle has a diameter of 300 μm, the smaller circle has a diameter of 100 μm, the larger square has a side length of 300 μm, and the smaller square has a side length of 100 μm.

The nanoporous carbon film having the ichnographic pattern was removed from the substrate and measured by a nitrogen absorption test. The results show the nanoporous carbon film has a specific surface area of 393 m$^2$/g, a pore volume of 0.521 cm$^3$/g, and an average pore diameter of 14.4 nm.

Embodiment 3

7 g of oleophilic nano silicon oxide powders (with a silicon oxide content of more than 99% and a particle diameter of about 30 nm) and 21 g of SU-8 photoresist series (model No. SU-8 2010) were mixed, and 21 g of cyclopentanone was added as a solvent for adjusting viscosity, so as to form a mixture. The mixture was subjected to a magnetic stirring for 4 hours and an ultrasonic agitation for 4 hours under a dark condition, until the mixture was mixed uniformly.

A silicon sheet was placed in a spin coater, and the rotating speed was adjusted to 1000 rpm. The uniformly mixed mixture was spin coated on the substrate (i.e. silicon sheet) to form a mixture film on the substrate, and the mixture film was prebaked at a temperature of 95° C. for 3 min. After cooled to room temperature, the mixture film was exposed with a photolithography machine, with an exposure intensity of 1080 mJ/cm$^2$, and then post-baked at a temperature of 95° C. for 3 min. The mixture film was developed with a dedicated developing solution for the SU-8 photoresist series to form a lithographic pattern in the mixture film. Then, the mixture film was baked at a temperature of 120° C. for 5 min to obtain a mixture film having an ichnographic pattern corresponding to the lithographic pattern and a thickness of 7 μm.

Figure 2:
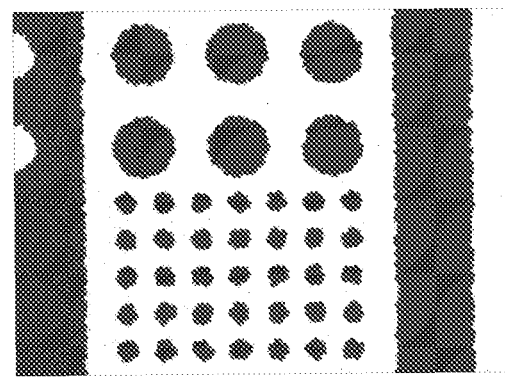
FIG. 2 shows a nanoporous polymer film having an ichnographic pattern observed under a microscope.

The mixture film having the ichnographic pattern was etched with a hydrofluoric acid solution (4 wt %) for 30 min to obtain a nanoporous polymer film having the ichnographic pattern. The ichnographic pattern of the nanoporous polymer film was shown in FIG. 2. FIG. 2 shows the ichnographic pattern of the nanoporous polymer film, observed under a microscope and enlarged by 50 times. In FIG. 2, the larger circle has a diameter of 300 μm, and the smaller circle has a diameter of 100 μm.

Embodiment 4

6 g of oleophilic nano silicon oxide powders (with a silicon oxide content of more than 99% and a particle diameter of about 30 nm) and 7 g of SU-8 photoresist series (model No. SU-8 100) were mixed, and 14 g of butyrolactone (Gamma Butyrolactone) was added as a solvent for adjusting viscosity, so as to form a mixture. The mixture was subjected to a magnetic stirring for 12 hours and an ultrasonic agitation for 6 hours under a dark condition, until the mixture was mixed uniformly.

A glass sheet was placed in a spin coater, and the rotating speed was adjusted to 3000 rpm. The uniformly mixed mixture was spin coated on the substrate (i.e. glass sheet) to form a mixture film on the substrate, and the mixture film was prebaked at a temperature of 95° C. for 3 min. After cooled to room temperature, the mixture film was exposed with a photolithography machine, with an exposure intensity of 992 mJ/cm$^2$, and then post-baked at a temperature of 95° C. for 3 min. The mixture film was developed with a dedicated developing solution for the SU-8 photoresist series to form a lithographic pattern in the mixture film. Then, the mixture film was baked at a temperature of 120° C. for 5 min to obtain a mixture film having an ichnographic pattern corresponding to the lithographic pattern and a thickness of 10 μm.

The mixture film having the ichnographic pattern was etched with a hydrofluoric acid solution (4 wt %) for 10 min to obtain a nanoporous SU-8 film.

Embodiment 5

0.3 g of oleophilic nano silicon oxide powders (with a silicon oxide content of more than 99% and a particle diameter of about 30 nm) and 5 g of SU-8 photoresist series (model No. SU-8 2007) were mixed to form a mixture. The mixture was subjected to a magnetic stirring for 4 hours and an ultrasonic agitation for 2 hours under a dark condition, until the mixture was mixed uniformly.

A silicon sheet was placed in a spin coater, and the rotating speed was adjusted to 2000 rpm. The uniformly mixed mixture was spin coated on the substrate (i.e. silicon sheet) to form a mixture film on the substrate, and the mixture film was prebaked at a temperature of 95° C. for 3 min. After cooled to room temperature, the mixture film was exposed with a photolithography machine, with an exposure intensity of 248 mJ/cm$^2$, and then post-baked at a temperature of 95° C. for 3 min. The mixture film was developed with a dedicated developing solution for the SU-8 photoresist series to form a lithographic pattern in the mixture film. Then, the mixture film was baked at a temperature of 120° C. for 2 min to obtain a mixture film having an ichnographic pattern corresponding to the lithographic pattern and a thickness of 20 μm.

The mixture film having the ichnographic pattern was heated to a temperature of 700° C. under a nitrogen atmosphere, and cooled to room temperature after maintaining the temperature of 700° C. for 1 hour. The cooled mixture film was etched with a mixed solution of a hydrofluoric acid solution (8 wt %) and ethanol with a volume ratio of 1:1 for 15 min to obtain a nanoporous carbon film having the ichnographic pattern.

What is claimed is:

1. A method for preparing a nanoporous film patterned by direct photolithography, wherein the nanoporous film comprises a nanoporous polymer film having a patterned structure or a nanoporous carbon film having a patterned structure, the method comprising the steps of:
   a) stirring a photoresist, adding a nano template material to the photoresist under the stirring with a weight ratio between the nano template material and the photoresist of 1:(1-20), adding a solvent to adjust viscosity with a weight ratio between the solvent and the nano template material of (0-10):1 to obtain a mixture, then subjecting the mixture to a mechanical stirring or a magnetic stirring for 1-2 hours and then an ultrasonic agitation for 0.5-2 hours, and repeating the mechanical stirring or the magnetic stirring and the ultrasonic agitation for 3-5 times to obtain an agitated mixture;
   b) spin coating the agitated mixture on a substrate with a rotating speed of about 200-4000 rpm to form a mixture film on the substrate, and baking the mixture film at a temperature of 80-100° C. for 3-30 minutes;
   c) exposing the mixture film with a photolithography machine, with an exposure intensity of 60-3000 mJ/cm$^2$, then baking the mixture film at a temperature of 80-100° C. for 3-30 minutes;
   d) developing the mixture film with a developing solution to form a lithographic pattern on the mixture film, then baking the mixture film having an ichnography pattern corresponding to the lithographic pattern at a temperature of 100-120° C.; and
   e) etching the mixture film having the ichnography pattern with a hydrofluoric acid solution or a mixed solution of hydrofluoric acid and ethanol with a volume ratio of 1:(1-5) to remove the nano template material to obtain the nanoporous polymer film, or
   heating the mixture film having the ichnography pattern to a temperature of 600-1500° C. under an inert gas atmosphere of nitrogen or argon or under vacuum, maintaining the temperature for 10-300 minutes to perform carbonization, and etching the mixture film with the hydrofluoric acid solution or the mixed solution of hydrofluoric acid and ethanol after cooling the mixture film to room temperature to remove the nano template material to obtain the nanoporous carbon film.

2. The method of claim 1, wherein the substrate comprises a silicon sheet, a glass sheet, or a polished metal sheet.

3. The method of claim 1, wherein the nano template material comprises nano silicon oxide particles with a particle diameter of 5-500 nm or a nanoporous silica gel with a pore size of 1-200 nm.

4. The method of claim 1, wherein the photoresist comprises a negative photoresist.

5. The method of claim 1, wherein the solvent comprises one or more alcohols, ketones, or esters.

* * * * *